United States Patent [19]

Vleggaar et al.

[11] Patent Number: 5,902,689
[45] Date of Patent: May 11, 1999

[54] ELECTROLUMINESCENT DEVICE

[75] Inventors: Jeroen J. M. Vleggaar; Adrianus J. M. Berntsen; Aemilianus G. J. Staring; Robert J. C. E. Demandt; Hermanus F. M. Schoo; Coen T. H. F. Liedenbaum, all of Eindhoven, Netherlands

[73] Assignee: U.S. Philips Corporation, New York, N.Y.

[21] Appl. No.: 08/691,905

[22] Filed: Aug. 1, 1996

[30] Foreign Application Priority Data

Aug. 3, 1995 [EP] European Pat. Off. ............. 95202116

[51] Int. Cl.[6] ................................................. H05B 33/00
[52] U.S. Cl. ........................... 428/690; 428/691; 428/917; 313/504; 313/507; 264/21
[58] Field of Search ..................................... 428/690, 691, 428/917; 313/504, 507; 264/21

[56] References Cited

FOREIGN PATENT DOCUMENTS 9013148  1/1990  WIPO .

OTHER PUBLICATIONS

E.J.G. Staring et al, *Advanced Materials*, 1994, 6, No. 12, pp. 934–937.

D. Braun et al., *Synthetic Metals*, 66 (1994) pp. 75–79.

P. L. Burn et al. in *Nature*, 356, pp. 47–49 (1992).

*Primary Examiner*—Charles Nold
*Attorney, Agent, or Firm*—Norman N. Spain

[57] ABSTRACT

A description is given of a method of providing an electroluminescent device (20) comprising an active layer (5) of conjugated 2,5-alkyl- or alkoxy-substituted poly(p-phenylene vinylene) with inactive regions (51) and emissive regions (52) by means of patterned irradiation with UV light. Both regions (51) and (52) of the active layer (5) show a clear difference in electroluminescence, electrical resistance and solubility. By means of the above-described effects, displays can be manufactured without making use of structured electrode layers (3) and (11).

8 Claims, 2 Drawing Sheets

ELECTROLUMINESCENT DEVICE

BACKGROUND OF THE INVENTION

The invention relates to an electroluminescent device comprising an active layer having an electroluminescent property, which layer includes 2,5-substituted poly(p-phenylene vinylene) and which is situated between two electrode layers, at least one of said electrode layers being transparent to the light to be emitted and, in operation, said device exhibiting a light-emitting pattern. The invention also relates to a method of manufacturing an electroluminescent (EL) device having a structured active layer.

The active layer and both electrode layers can jointly form one light-emitting diode (LED), but the EL device preferably comprises various LEDs, for example in the form of a matrix of light-emitting surfaces, as intended for a display. An EL device emits light when an electric field is applied across the active or emissive layer. Such a device cannot only be used as a display but also, for example, as a light source.

The use of inorganic materials such as GaAs for the active layer has been known for a long time. Since a few years also organic materials are known, in particular semiconductive organic polymers, which can be used for the active layer. Semiconductive organic polymers have a conjugated polymer chain. A well-known polymer is, for example, poly(p-phenylene vinylene) (PPV), in particular 2,5-substitued PPV. The band gap, the electron affinity and the ionization potential can be adjusted by choosing the proper conjugated polymer chain and proper side chains. Unlike electrically conducting polymers, these conjugated polymers are undoped. In addition, such polymers enable flexible substrates to be used. The active layer of an organic polymer is situated between two electrode layers of electrically conducting materials, namely one for the injection of holes and one for the injection of electrons into the active layer.

Both electrode layers can be structured in accordance with a pattern by means of a customary photolithographic process, so that the desired pattern for a display or, for example, for an illuminated logo is obtained. In a typical example of a display, the electrodes of the first and the second electrode layers have line structures which intersect each other at right angles and hence form a matrix of individually addressable rectangular LEDs. Said rectangular LEDs form the pixels or picture elements of the display. If the electrodes of the first and the second electrode layers are connected to a voltage source, light-emitting pixels are formed at the intersections of the electrodes.

Such an EL device is known from the international Patent Application WO 90/13148. In said known EL device both electrode layers are provided in the form of strips intersecting at right angles by means of a vacuum-evaporation process. For this purpose use is made of a mask during said vacuum-evaporation process. A drawback of said known method is that both electrode layers must be structured in order to cause individual pixels to luminesce.

OBJECTS AND SUMMARY OF THE INVENTION

It is an object of the invention to provide, inter alia, a simpler EL device which, in operation, exhibits a light-emitting pattern and in which none of the electrodes has to be structured. The invention further aims at providing a simple method of manufacturing such an EL device.

These objects are achieved by an EL device as described in the opening paragraph, which is characterized in accordance with the invention in that the electroluminescent property of the active layer is locally substantially absent, representing said pattern.

A method which will be specified hereinbelow is used to provide the active layer with regions in which the electroluminescent property has disappeared completely or almost completely. The remaining regions of the active layer do have this electroluminescent property. When an electric field is applied across the active layer by means of non-structured electrodes, light emission only takes place from regions having said electroluminescent property, so that, for example, a logo can be displayed.

The active layer preferably comprises poly(2,5-dialkyl-p-phenylene vinylene), poly(2,5-dialkoxy-p-phenylene vinylene) or corresponding cyano-PPVs. In these polymers a difference in electroluminescence of approximately a factor of $10^5$ can be attained. In addition, this difference is accompanied by a difference in specific resistance of the active layer of approximately a factor of $10^2$, i.e. when an electric field is applied across the active layer, the current runs predominantly through the regions having electroluminescent properties. Thus, the leakage current through non-electroluminescent regions is very small.

The object of providing a method of manufacturing the above-mentioned electroluminescent device is achieved by a method in which an active layer comprising 2,5-substituted poly(p-phenylene vinylene) is applied to a substrate provided with a first electrode layer, whereafter a second electrode layer is applied to said active layer, which method is characterized in accordance with the invention in that, prior to the application of the second electrode layer, the active layer is exposed to patterned radiation with UV light in the presence of oxygen, so that in the irradiated regions the electroluminescent property of the active layer disappears completely or almost completely.

It has been found that UV light in combination with oxygen causes rapid photochemical oxidation of said PPV compounds. The advantage of the method in accordance with the invention lies in its simplicity: apart from exposure to UV light, no other process steps are necessary to structure the EL device. By means of the method in accordance with the invention, an EL device is obtained which, in operation, exhibits a light-emitting pattern while using non-structured electrodes.

The UV light may originate, for example, from a mercury lamp which emits light having a wavelength of predominantly 365 nm. Patterned exposure can take place, for example, via a (shadow) mask. Dependent upon the layer thickness of the active layer and the power of the mercury lamp, an exposure time in the range from one to several minutes is sufficient to cause the electroluminescent properties of the active layer to disappear completely. In addition, said exposure to UV light causes the specific resistance of the exposed parts of the layer to increase by a factor of $10^2$.

Suitable 2,5-substituted PPV compounds for the method in accordance with the invention comprise one of the formulas (I) or (II) as the repeating unit:

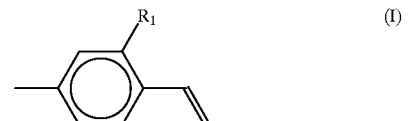

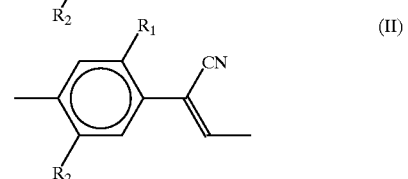

where $R_1$ and $R_2$ represent a $C_1$–$C_{20}$ alkyl group or alkoxy group. The degree of polymerization of the conjugated polymer ranges between 10 and approximately 100,000. In view of the improved solubility of the conjugated PPV in organic solvents, the substituents $R_1$ and $R_2$ preferably have chains of unequal length. Said PPV compounds are readily soluble, namely 1 to 3 wt. %, in many organic solvents such as toluene, xylene, tetrahydrofuran and mixtures of these solvents, so that the active layer of the EL device can be manufactured, for example, by means of spin coating. The alkyl or alkoxy substituents $R_1$ and $R_2$ in said formulas may be unbranched or branched.

It has been found that the use of alkyl or alkoxy substituents which are longer than approximately $C_{12}$ does not lead to a noticeable increase of their solubility in organic solvents; besides, the quantity of active material per gram of conjugated PPV decreases due to the presence of longer alkyl substitutents. As they exhibit a good solubility, preferably, branched alkyl or alkoxy substitutents $R_1$ and $R_2$ are used.

Suitable alkyl substitutents $R_1$ are the 3,7-dimethyl octyl group ($C_{10}$), the 4,6,6-trimethyl heptyl group ($C_{10}$), the n-undecyl group ($C_{11}$) and the n-dodecyl group ($C_{12}$).

Suitable alkyl substitutents $R_2$ are the methyl group $C_1$, the ethyl group ($C_2$), the propyl group ($C_3$) and the n-butyl group ($C_4$).

Suitable alkoxy substitutents $R_1$ and $R_2$ are, for example, the decyloxy group ($OC_{10}$) and the methoxy group ($OC_1$ or $OCH_3$), respectively.

Examples of PPV compounds which can suitably be used in the method in accordance with the invention are:
poly[2-methyl-5-(n-dodecyl)-p-phenylene vinylene],
poly[2-methyl-5-(3,7-dimethyl octyl)-p-phenylene vinylene],
poly[2-methyl-5-(4,6,6-trimethyl heptyl)-p-phenylene vinylene], poly(2-methoxy-5-decyloxy-p-phenylene vinylene), and
poly[2-methoxy-5-(2-ethyl hexyloxy)-p-phenylene vinylene] (MEH-PPV).

The preparation of a poly(2,5-dialkyl-p-phenylene vinylene) is described in article by E. G. J Staring et al., Advanced Materials, 1994, 6, No. 12, 934–937. The preparation of a poly(2,5-dialkoxy-p-phenylene vinylene) is described in an article by D. Braun et al., Synthetic Metals, 66 (1994) 75–79.

The active layer of said PPV compounds can be provided on the substrate from a solution of the conjugated PPV in a solvent. For this purpose, all application methods which are known per se can be used, however, the layer is preferably provided by spin coating. The layer thickness of the active layer is governed, inter alia, by the concentration of the polymer used in the solvent and by the number of revolutions during spin coating. The layer can be provided at room temperature and, apart from the evaporation of the solvent, no further thermal aftertreatment is required. By virtue thereof, many synthetic resin substrates which do not withstand high temperatures can be used. The active layer of a PPV compound can also be obtained by thermal conversion of a non-conjugated precursor polymer, as described in the above-mentioned international Patent Application WO 90/13148.

The layer thickness of the active layer of the PPV compound often ranges between 50 and 200 nm, in particular between 75 and 150 nm.

The active layer is present between two electrode layers of electroconductive materials. At least one of said electrode layers should be transparent or transmit the light emitted by the active layer. One of the electrode layers serves as the electrode for the injection of holes into the active layer. The material of the first electrode layer has a high work function and is formed, for example, by a thin layer of gold or silver, or preferably a layer of tin oxide or indium-tin oxide (ITO). Such layers are transparent to the light emitted by the active layer. Particularly ITO is suitable owing to the fact that it has a good electroconductivity and a high transparency. Also conductive polyaniline or poly-3,4-ethylene dioxythiophene can be used as the transparent electrode layer.

The second electrode layer serves as the electrode for the injection of electrons into the active layer. The material for this layer has a low work function and is formed by a layer, for example, of indium, aluminium, calcium, barium or magnesium. In particular when use is made of reactive barium, it is efficacious to cover this second electroconductive layer with a protective layer, for example, of epoxy or an inert metal. The electrode layers can be provided on the substrate by means of methods which are known per se, such as vacuum evaporation, sputtering or a CVD process.

Optionally, a charge-transport layer is provided between an electrode layer and the active layer.

The layers for the EL structure are provided on a substrate which is composed, for example, of glass, quartz glass, ceramic or synthetic resin materials. Preferably use is made of a translucent or transparent substrate, for example a transparent flexible foil of a synthetic resin material. Suitable transparent synthetic resins are, for example, polyimide, polyethylene terephtalate and polytetrafluoroethylene.

It is noted that in an article by P. L. Burn et al. in Nature, 356, 47–49 (1992) a description is given of a method in which a non-conjugated precursor polymer with methoxy as leaving group is thermally converted to a conjugated PPV compound at 220° C. The methoxy groups are eliminated in the presence of HCl and another PPV compound is formed. Patterned conversion takes place by locally covering a layer of the precursor polymer with vapour-deposited aluminium strips, heating said layer to 220° C. in the presence of HCl and, subsequently, removing the aluminium. The regions of the PPV layer which were covered during the thermal treatment are of a different color during electroluminescence. In this manner patterns of differently colored electroluminescent regions can be manufactured. The known method is rather time-consuming and requires the presence of the corrosive HCl gas. In addition, when use is made of the known method, it is impossible to manufacture dark regions next to light-emitting regions.

A particular embodiment of the method in accordance with the invention is characterized in that, after patterned irradiation with UV light, the active layer is brought into contact with an organic solvent, so that the irradiated regions of the active layer are dissolved, thereby forming a relief structure of non-irradiated regions of the active layer. It has been found that by subjecting an active layer of the above-mentioned 2,5-substituted PPV compounds to UV light in the presence of oxygen, not only the electroluminescent properties and the specific resistance are changed, but also the solubility of the active layer. Prior to exposure to UV light, the active layer is extremely slightly soluble in organic solvents such as acetone, methanol, ethanol and ethyl acetate. After exposure to UV light, the solubility of said layer in the above solvents has increased substantially. This enables the active layer to be developed just like a photoresist by removing the exposed parts in said solvents, thereby structuring the active layer of the EL device.

These and other aspects of the invention will be apparent from and elucidated with reference to the embodiments described hereinafter.

DETAILED DESCRIPTION OF THE PREFERRED EMBODIMENTS

Exemplary embodiment 1

Figure 1A:
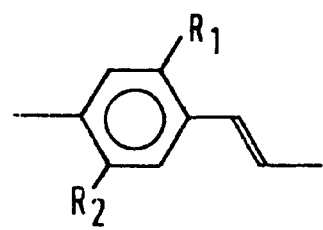
FIG. 1 shows the formulae (1) and (II) of a repeating unit of a conjugated 2,5-substituted PPV.
Figure 1B:
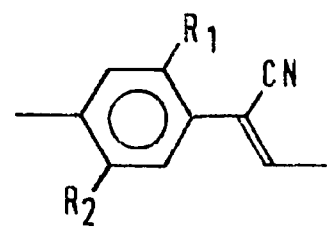

A conjugated 2,5-dialkoxy-substituted PPV in which $R_1=OC_{10}H_{21}$ and $R_2=OCH_3$ (poly[2-methoxy-5-decyloxy-p-phenylene vinylene]: FIG. 1, formula (I)) is prepared by polymerization of 1,4-bischloromethyl-2-methoxy-5-decyloxy benzene. The preparation is described in the above-mentioned article by D. Braun et al., Synthetic Metals, 66 (1994) 75–79. The polymer obtained is readily soluble, inter alia, in toluene, tetrahydrofuran and xylene.

Figure 2A:
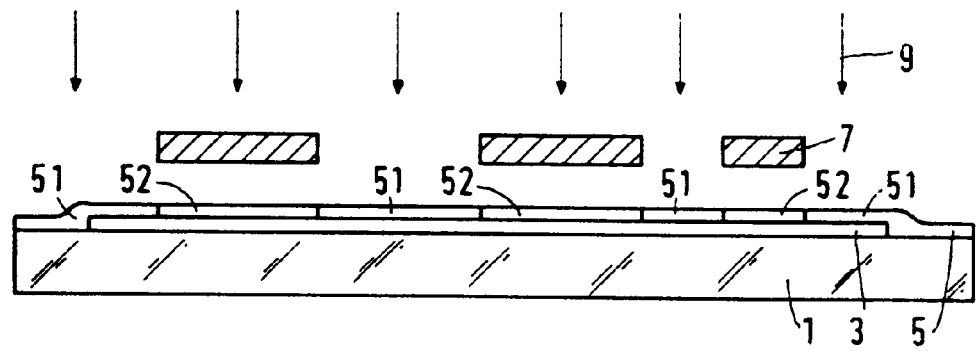
FIGS. 2A and 2B are schematic cross-sectional views of the manufacture of an EL device during two stages of a method in accordance with the invention.

In the schematic FIGS. 2A and 2B to be discussed hereinbelow, the dimensions, such as the layer thicknesses, are not drawn to scale. In FIG. 2A, reference numeral 1 represents a part of a cross-section of a glass substrate. A transparent indium-tin-oxide layer (ITO) 3 having a thickness of 150 nm and a surface resistance of less than 20 $\Omega$/square is deposited by means of sputtering. Said layer 3 serves as the electrode layer for injecting holes into the active layer 5 of conjugated poly[2-methoxy-5-decyloxy-p-phenylene vinylene] which is to be provided later. This active layer 5 having a thickness of 100 nm is manufactured by spin coating an 1 wt. % solution of the above-mentioned polymer in toluene at a rate of 1000 r.p.m. for 25 s.

A metal mask 7 having apertures is provided above the active layer 5. A medium-pressure mercury lamp having a power of 400 W is used to expose the active layer 5, via this mask 7, in air to UV light 9 having a wavelength of predominantly 365 nm for 5 minutes. The distance between the mercury lamp and the active layer 5 is 25 cm. Exposed regions 51 in which the electroluminescent property has disappeared substantially completely are formed in the active layer 5. In the unexposed regions 52 the electroluminescent property is preserved.

Figure 2B:
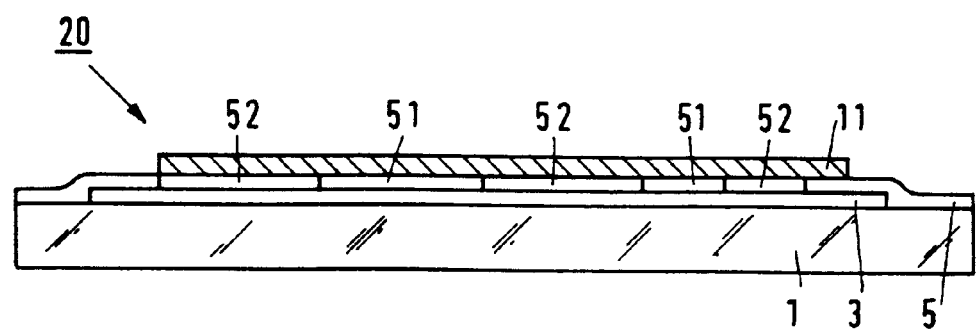

The active layer 5 is provided with a liquid indium/gallium amalgam layer 11 (FIG. 2B). This layer 11 serves as the electrode layer for injecting electrons into the active layer 5. The electroluminescent device 20 is now ready for use and its structure is composed of LEDs at the area of the regions 52 which are not exposed to UV light.

Both electrode layers 3 and 11 are connected to a direct-current source. The active layer 5 emits orange light from the unexposed regions 52, while the exposed parts 51 are passivated and remain dark.

The electroluminescence is detected on the side of the substrate by means of an Si-photodiode (Hamamatsu S1227-1010BQ) and a Keithley 617 electrometer. The I-V (current-voltage) characteristic of the device is measured by means of a Hewlett-Packard 4140B pA-meter/voltage source.

Figure 3:
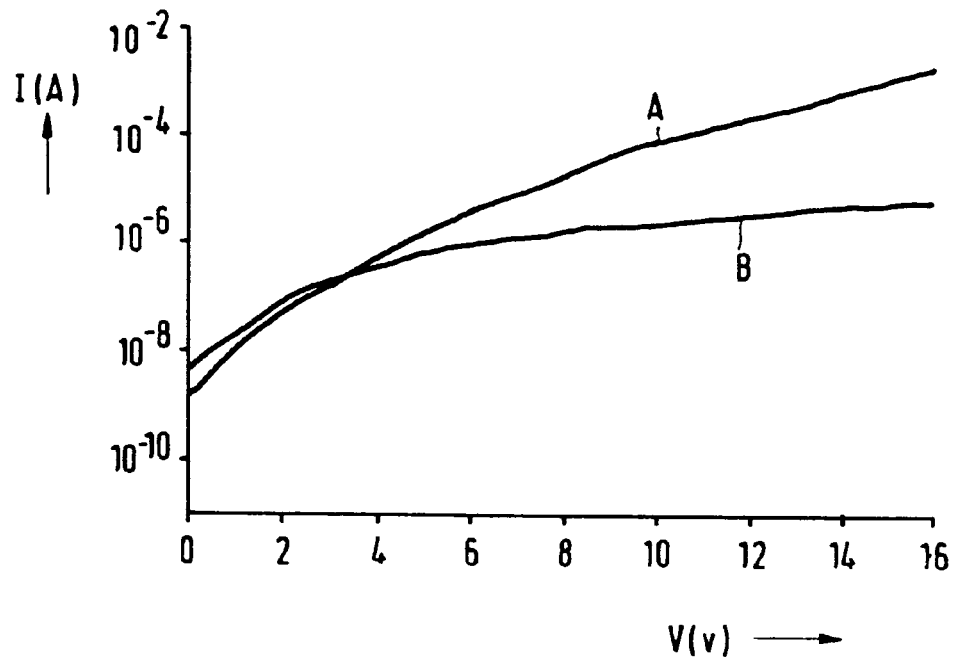
FIG. 3 shows an I-V (current-voltage) characteristic of, respectively, unexposed regions (curve A) and exposed regions (curve B) of an EL device in accordance with the invention.

FIG. 3 shows the I-V characteristic of the EL device 20 obtained, in which the current I in ampère is plotted as a function of the applied voltage V in volt between the electrodes. Curve A shows the current I of the unexposed parts 52. Curve B shows the current of the parts 51 which are passivated by exposure to light. FIG. 3 shows that, at a constant voltage, the current decreases to maximally a factor of $10^2$ at voltages above 4 volts under the influence of the UV radiation. It is favorable that the passivated parts 51 of the active layer 5 have a higher specific resistance than the unexposed parts 52. By virtue thereof, the current density through the passivated parts 51 is much lower than in the emitting parts 52, so that the leakage current is small.

Figure 4:
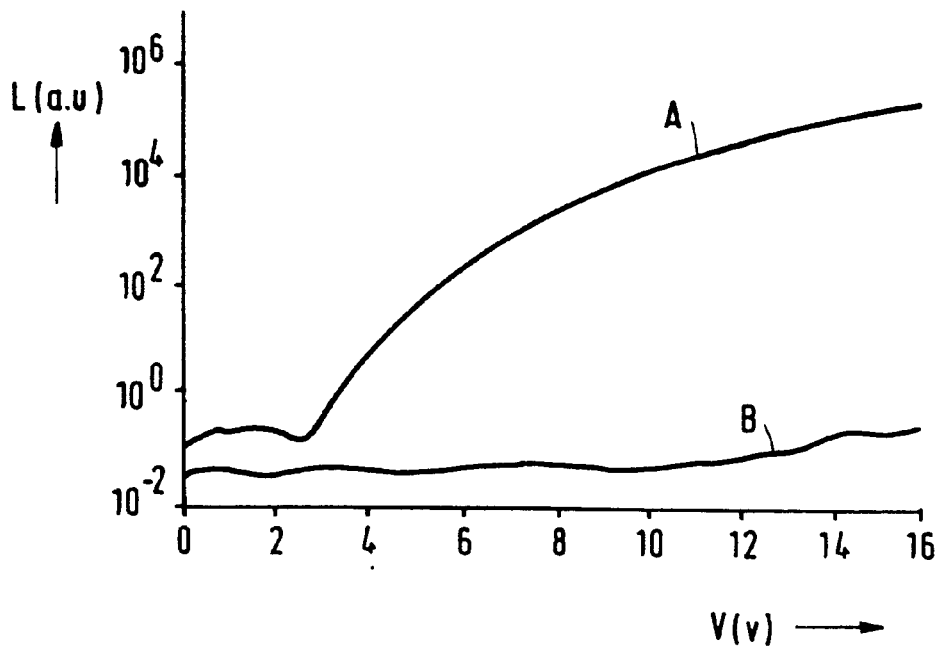
FIG. 4 shows an L-V (luminescence-voltage) characteristic of, respectively, unexposed regions (curve A) and exposed regions (curve B) of an EL device in accordance with the invention.

FIG. 4 shows the amount of light L (electroluminescence) in arbitrary units (a.u.) as a function of the voltage V in volt. Curve A applies to the unexposed parts 52, while curve B applies to the passivated parts 51. FIG. 4 shows that, at a constant voltage, the electroluminescence decreases by a factor of $10^5$ under the influence of the UV radiation.

Exemplary embodiment 2

The structure shown in FIG. 2A is exposed to patterned radiation with UV light in accordance with exemplary embodiment 1. In this case, the exposure time is 15 minutes. The exposed active layer 5 is developed, just like a photoresist, in acetone and subsequently dried. The exposed parts 51 are removed as far as the electrode layer within 30 seconds, while the unexposed parts 52 are hardly dissolved. In this manner a relief structure is formed in the active layer 5, which is suitable, in particular for the manufacture of displays.

The method in accordance with the invention provides a simple manner, namely exposing the active layer to UV light in accordance with a pattern, of manufacturing EL devices of which the electrical and electroluminescent properties of the active layer are changed in accordance with a pattern without the necessity of structuring the electrode layers. In addition, the solubility of the active layer is changed in accordance with a pattern, so that the active layer can be structured in the form of a relief by means of a developing step. The method is particularly suitable for manufacturing a display which shows only a specific image, such as a logo.

We claim:

1. An electroluminescent device comprising an active layer having an electroluminescent property, which layer includes 2,5-substituted poly(p-phenylene vinylene) and which is situated between two electrode layers, at least one of said electrode layers being transparent to the light to be emitted, and, in operation, said device exhibiting a light-emitting pattern, characterized in that the electroluminescent property of the active layer is substantially absent locally thereby providing said pattern.

2. An electroluminescent device as claimed in claim 1, characterized in that the active layer comprises poly(2,5-dialkyl-p-phenylene vinylene).

3. An electroluminescent device as claimed in claim 1, characterized in that the active layer comprises poly(2,5-dialkoxy-p-phenylene vinylene).

4. A method of manufacturing an electroluminescent device as claimed in claim 1, in which an active layer comprising 2,5-substituted poly(p-phenylene vinylene) is applied to a substrate provided with a first electrode layer, whereafter a second electrode layer is applied to said active layer, characterized in that prior to the application of the second electrode layer, the active layer is exposed to patterned radiation with UV light in the presence of oxygen, so that in the irradiated regions the electroluminescent property of the active layer disappears completely or almost completely.

5. A method as claimed in claim 4, characterized in that poly(2,5-dialkyl-p-phenylene vinylene) is used for the active layer.

6. A method as claimed in claim 4, characterized in that poly(2,5-dialkoxy-p-phenylene vinylene) is used for the active layer.

7. A method as claimed in claim 4, characterized in that after patterned irradiation with UV light, the active layer is brought into contact with an organic solvent, so that the irradiated regions of the active layer are dissolved, thereby forming a relief structure of non-irradiated regions of the active layer.

8. A method as claimed in claim 4, characterized in that poly(2-methoxy-5-decyloxy-p-phenylene vinylene) is used.

* * * * *